(12) United States Patent
Asami et al.

(10) Patent No.: US 6,418,055 B1
(45) Date of Patent: Jul. 9, 2002

(54) ONE-CHIP MICROCOMPUTER

(75) Inventors: Takashi Asami, Saitama; Masamitsu Hashimoto; Kazuyoshi Takemasa, both of Gunma, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/458,221

(22) Filed: Dec. 9, 1999

(30) Foreign Application Priority Data

Dec. 10, 1998 (JP) ............................................ 10-351778

(51) Int. Cl.$^7$ ................................................ G11C 16/06
(52) U.S. Cl. ..................................... 365/185.2; 365/210
(58) Field of Search ............................... 365/185.2, 210, 365/185.29, 185.3

(56) References Cited

U.S. PATENT DOCUMENTS

| | | | |
|---|---|---|---|
| 5,596,527 A | * 1/1997 | Tomioka et al. | 365/185.2 |
| 5,828,602 A | 10/1998 | Wong | 365/185.2 |
| 5,923,589 A | 7/1999 | Kaida et al. | 365/185.28 |
| 6,000,843 A | 12/1999 | Sawada | 371/21.4 |
| 6,163,484 A | * 12/2000 | Uekubo | 365/185.2 |

FOREIGN PATENT DOCUMENTS

| | | |
|---|---|---|
| JP | 63291475 A | 11/1988 |
| JP | 06020486 A | 1/1994 |
| JP | 10134579 A | 5/1998 |
| JP | Hei. 11-17154 | 1/1999 |

* cited by examiner

Primary Examiner—Son T. Dinh
Assistant Examiner—Anh Phung
(74) Attorney, Agent, or Firm—Fish & Richardson P.C.

(57) ABSTRACT

In a one-chip microcomputer that incorporates a nonvolatile memory in which data can be electrically erased and data can be written and read, as a program memory, a reference nonvolatile memory group 40 which is lower in characteristic than a nonvolatile memory 7 in a memory cell array is disposed, and, on the basis of a result of reference of the reference nonvolatile memory group 40, the erase voltage of an erasing operation which is previously stored in a specific address region of the nonvolatile memory 7 is changed by a control circuit 44. On the basis of a result of reference of the reference nonvolatile memory group 40, the reference level of a reading operation of a sense amplifier which is previously stored in a specific address region of the nonvolatile memory 7 is changed by the control circuit 44.

5 Claims, 6 Drawing Sheets

LOG (NUMBER OF DATA REWRITING)

LOG (NUMBER OF DATA REWRITING)

LOG (NUMBER OF DATA REWRITING)

ONE-CHIP MICROCOMPUTER

BACKGROUND OF THE INVENTION

The present invention relates to a one-chip microcomputer incorporating a nonvolatile memory (for example, a flash memory) which enables electrical erasing.

FIG. 8 is a cell diagram showing a programmed state of a usual split gate nonvolatile memory. The reference numeral 1 denotes a control gate, 2 denotes a floating gate, 3 denotes a drain, and 4 denotes a source. The floating gate 2 is formed on a gate oxide film which is formed on a semiconductor substrate, and a tunnel oxide film is formed to be integrated with the gate oxide film so as to cover the floating gate 2. The control gate 1 is formed on the tunnel oxide film.

When the nonvolatile memory of FIG. 8 is to be set to the programmed state (i.e. programming mode), for example, voltages of 2 volts, 0 volt, and 12 volts are applied to the control gate 1, the drain 3, and the source 4, respectively.

The control gate 1 is capacitive coupled to the floating gate 2, and the floating gate 2 is capacitive coupled to the source 4 ((capacitance between the control gate 1 and the floating gate 2) <<(capacitance between the floating gate 2 and the source 4)). Although no voltage is applied to the floating gate 2, therefore, the state of the floating gate is set to be equivalent to that where a high voltage of, for example, 11 volts is applied to the floating gate, by the capacitive coupling ratio.

As a result, a channel in that electrons are continuously arranged is formed between the drain 3 and the source 4, and hot electrons in the channel are injected into the floating gate 2 through the gate oxide film, so that the floating gate 2 is negatively charged. This state is the programmed state of the nonvolatile memory.

FIG. 9 is a cell diagram showing a reading state of a nonvolatile memory which is in the programmed state, and FIG. 10 is a cell diagram showing a reading state of a nonvolatile memory which is not in the program state.

In both the nonvolatile memories of FIGS. 9 and 10, when the reading state is to be set, for example, voltages of 5 volts, 2 volts, and 0 volt are applied to the control gate 1, the drain 3, and the source 4, respectively. In the case of FIG. 9, since electrons are injected into the floating gate 2, a channel is not formed between the drain 3 and the source 4, so that the nonvolatile memory cell is turned off.

By contrast, in the case of FIG. 10, since no electron exists in the floating gate 2, a channel is formed between the drain 3 and the source 4, so that the nonvolatile memory cell is turned on.

FIG. 7 is a block diagram of a configuration for outputting a logical value "0" or "1" in accordance with the programmed state of a nonvolatile memory cell. The reference numeral 5 denotes a nonvolatile memory cell, and 6 denotes a sense amplifier. The sense amplifier 6 outputs a voltage value of 0 volt (logical value "0") or a voltage value of 5 volts (logical value "1") in accordance with a result of a comparison between an output current (also called a read current or a cell current) of the nonvolatile memory cell 5 and a reference current Iref.

When the nonvolatile memory cell 5 is in the programmed state as shown in FIG. 9, the sense amplifier 6 detects that the output current (read current Iw) of the nonvolatile memory 5 is smaller than the reference current Iref, and then outputs the logical value "0."

On the other hand, when the nonvolatile memory cell 5 is not in the program state as shown in FIG. 10 (erased state), the sense amplifier 6 detects that the output current (read current Ii) of the nonvolatile memory cell 5 is larger than the reference current Iref, and then outputs the logical value "1."

Conventionally, the output current (read current Ii) in the case where the memory cell 5 is not in the program state (erased state) is gradually reduced from the initial value of 100 $\mu$A by repeating rewriting of data, and, at the timing when the output current is reduced to 30% of the initial value, e.g. 30 $\mu$A (or the reference current Iref), the number of data rewritings (T1) is deemed to reach its limit. The operation life of the memory cell is judged to terminate at the timing (see FIG. 12). As shown in FIG. 12, Iw is substantially constant irrespective of the number of data rewritings.

FIG. 11 is a cell diagram showing the erasing state of the nonvolatile memory. For example, a voltage of 14 volts is applied to the control gate 1, and a voltage of 0 volt is applied to the drain 3 and the source 4.

Then, F-N tunneling (Fowler-Nordheim tunneling) occurs so that the electrons which have been injected into the floating gate 2 are moved into the control gate 1 via the tunnel oxide film. Since the drain 3 and the source 4 have the same potential, a channel is not formed therebetween. This is the erase state of the nonvolatile memory cell.

As described above, fixed voltages are respectively applied to the control gate 1, the drain 3, and the source 4 for given time periods in accordance with the state of the nonvolatile memory, i.e., the programming, the reading, or the erasing.

In a one-chip microcomputer incorporating such a nonvolatile memory, when the nonvolatile memory is to be used as a ROM, the data retention characteristics play an important role.

Particularly, the memory cell 5 has the following problem. When the writing and erasing operations are repeatedly conducted, an electron trap is formed in the tunnel oxide film interposed between the floating gate 2 and the control gate 1, by stress applied to the tunnel oxide film.

The electron trap functions as a barrier to impede the movement of electrons from the floating gate 2 to the control gate 1 (in the direction of the arrow in FIG. 11), thereby producing a problem in that the operational life of the nonvolatile memory cell 5 is restricted.

With respect to the limit, as described above, the operational life of the nonvolatile memory cell 5 is deemed to terminate at the timing when the output current (read current Ii) in the case where the memory cell 5 is not in the program state (or is in the erase state) is reduced to 30% of the initial value of 100 $\mu$A, or to 30 $\mu$A.

SUMMARY OF THE INVENTION

Therefore, it is an object of the invention to provide a one-chip microcomputer in which preset conditions for the erasing operation can be changed in order to extend the operational life of a memory cell where data are erased by using F-N tunneling. It is another object of the invention to provide a one-chip microcomputer in which a reference level of a reading operation of a sense amplifier can be controlled in order to extend the operational life of a memory cell where data are erased by using F-N tunneling.

The invention has been conducted in order to solve the problems. The one-chip microcomputer of the invention is a one-chip microcomputer that incorporates a nonvolatile memory in which data can be electrically erased and data can be written and read, as a program memory, and is characterized in that a reference nonvolatile memory group 40 which is lower in characteristic than a nonvolatile memory 7 in a memory cell array is disposed, and, on the basis of a result of reference of the reference nonvolatile memory group 40, the erase voltage or the erase time which is previously stored in a specific address region of the nonvolatile memory 7 is changed by a control circuit 44.

The one-chip microcomputer of the invention is characterized in that a reference nonvolatile memory group 40 which is lower in characteristic than a nonvolatile memory 7 in a memory cell array is disposed, and, on the basis of a result of reference of the reference nonvolatile memory group 40, the reference level of a reading operation of a sense amplifier which is previously stored in a specific address region of the nonvolatile memory 7 is changed by a control circuit 44.

Furthermore, the one-chip microcomputer is characterized in that the reference nonvolatile memory group 40 has a cell structure in which the gate length is longer than that of the internal nonvolatile memory 7, or a the gate width is shorter than that of the nonvolatile memory 7.

Figure 4:
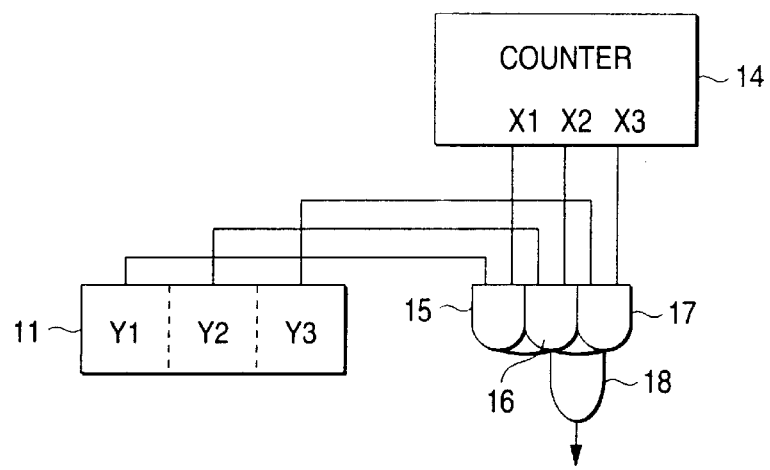
Figure 5:
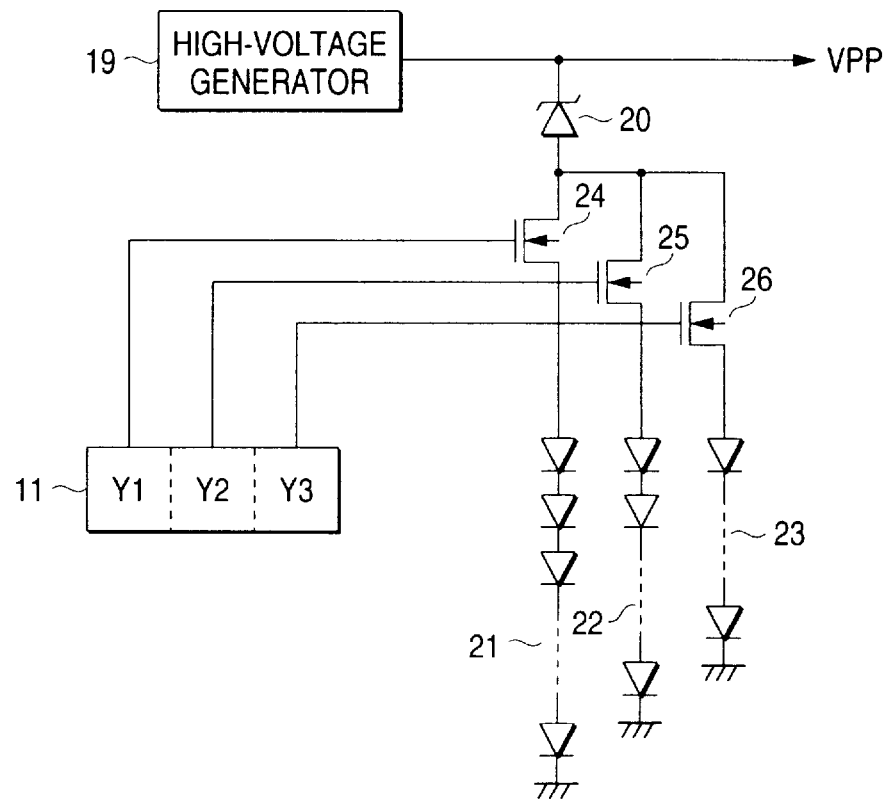
Figure 6:
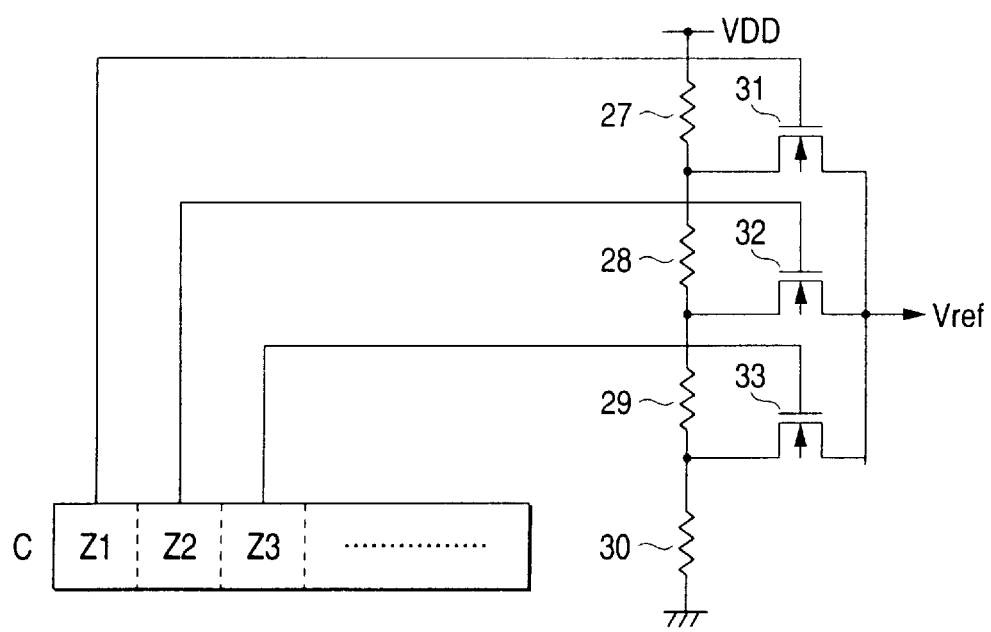
Figure 7:
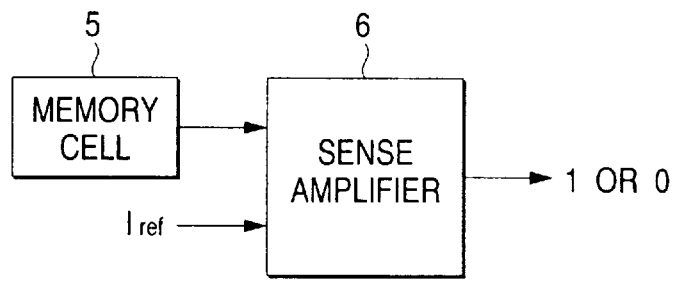
Figure 8:
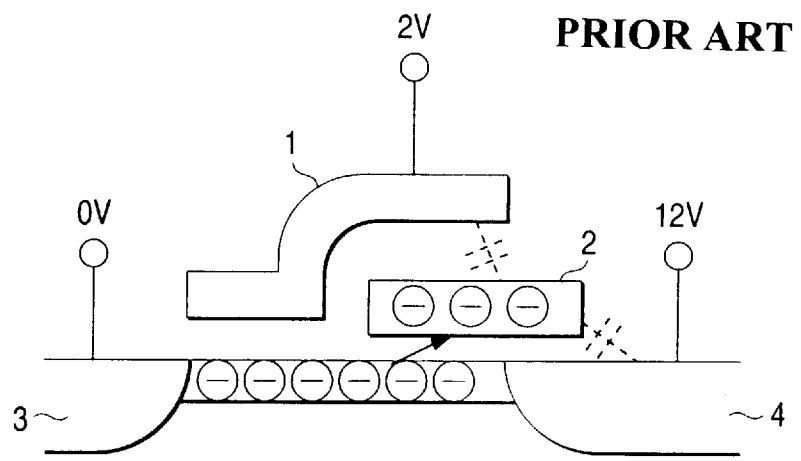
Figure 9:
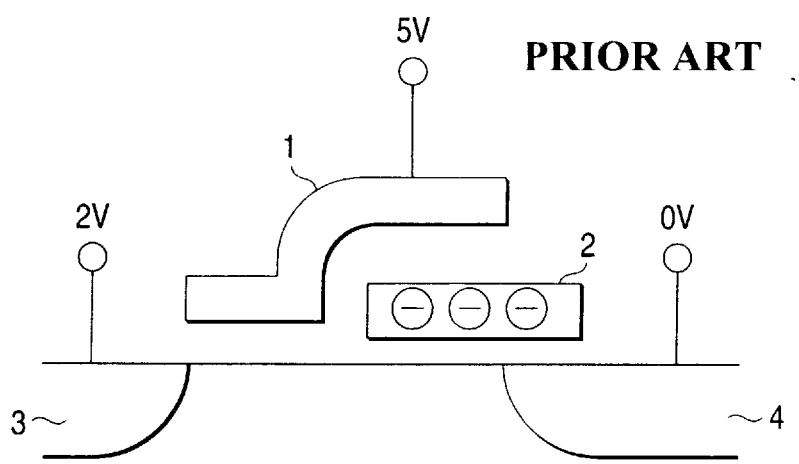
Figure 10:
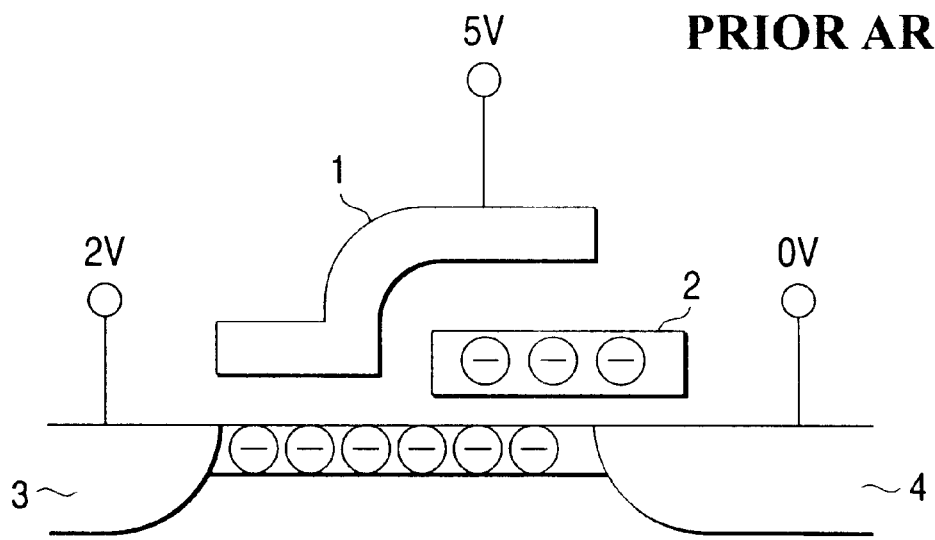
Figure 11:
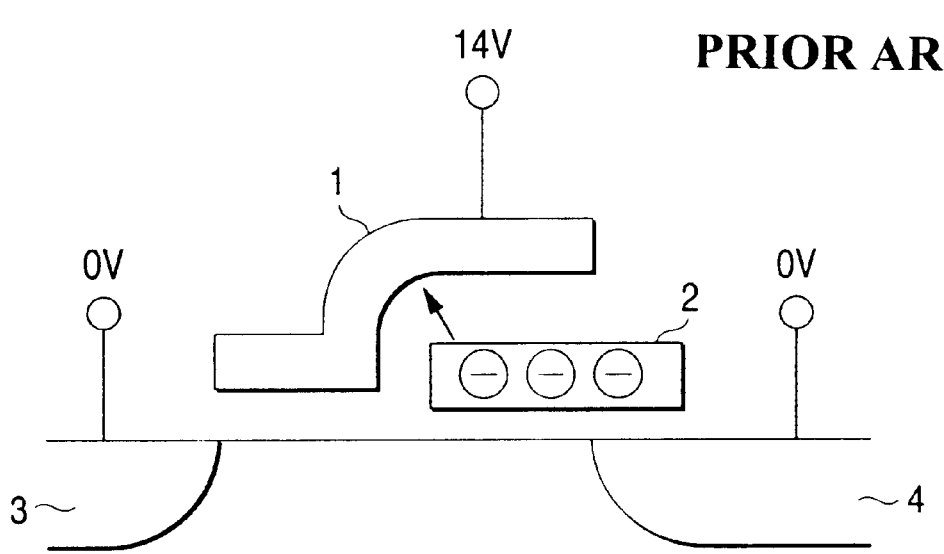
Figure 12:
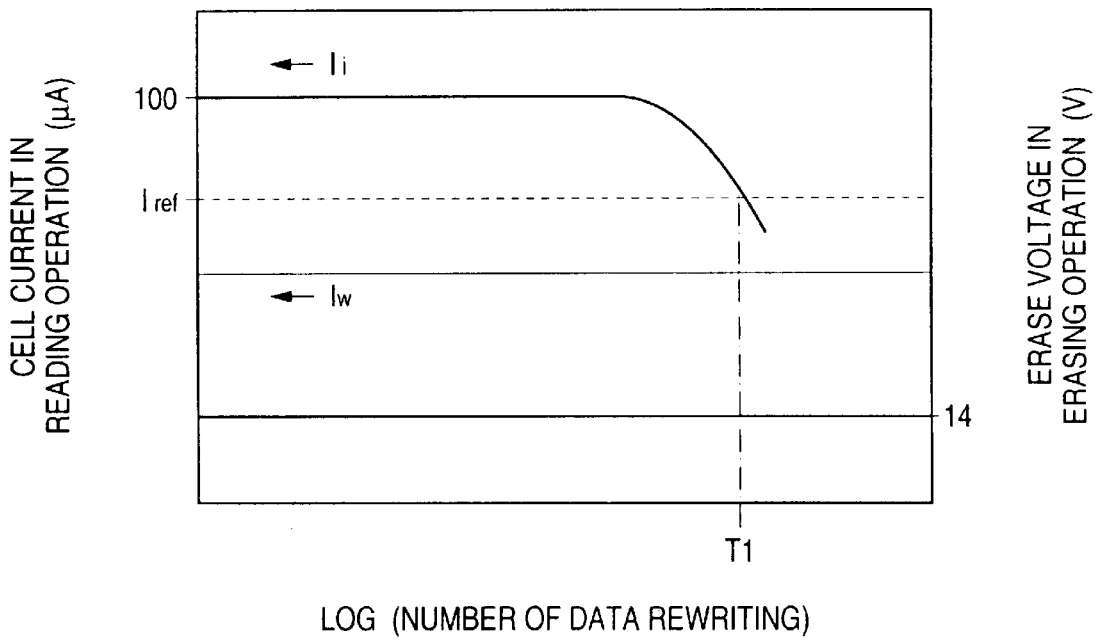
Figure 13:
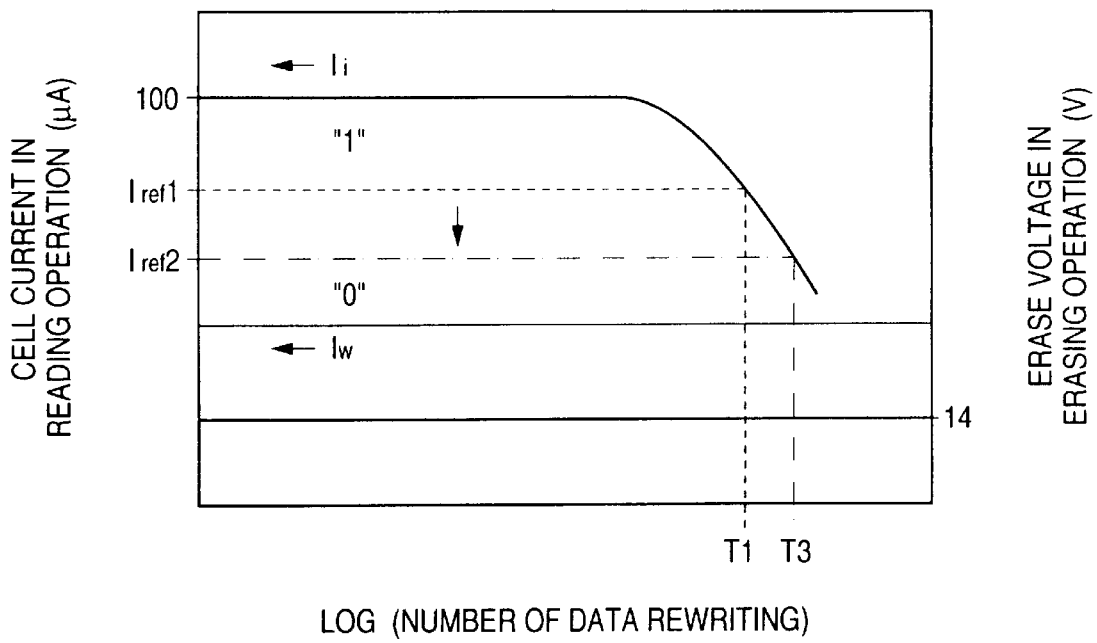

FIlG 3 is a block diagram showing a one-chip microcomputer according to the invention;

FIG. 4 is a block diagram of a circuit for controlling the times of the writing voltage, the reading voltage, and the erasing voltage of the nonvolatile memory;

FIG. 5 is a block diagram of a circuit for controlling the levels of the writing voltage, the erasing voltage, and the reading voltage of the nonvolatile memory;

FIG. 6 is a block diagram of a circuit for controlling the reference voltage of a sense amplifier;

FIG. 7 is a block diagram showing a sense amplifier of the nonvolatile memory;

FIG. 8 is a cell diagram showing a programmed state of a nonvolatile memory;

FIG. 9 is a cell diagram showing a reading state of a nonvolatile memory which is in the programmed state;

FIG. 10 is a cell diagram showing a reading state of a nonvolatile memory which is not in the programmed state;

FIG. 11 is a cell diagram showing the erasing state of a nonvolatile memory;

FIG. 12 is a characteristic diagram illustrating problems of a prior art nonvolatile memory; and FIG. 13 is a characteristic diagram illustrating the operation of another embodiment of a nonvolatile memory which is used in the invention.

DETAILED DESCRIPTION OF THE PREFERRED EMBODIMENTS

Hereinafter, the invention will be described in detail with reference to the accompanying drawings.

Figure 3:
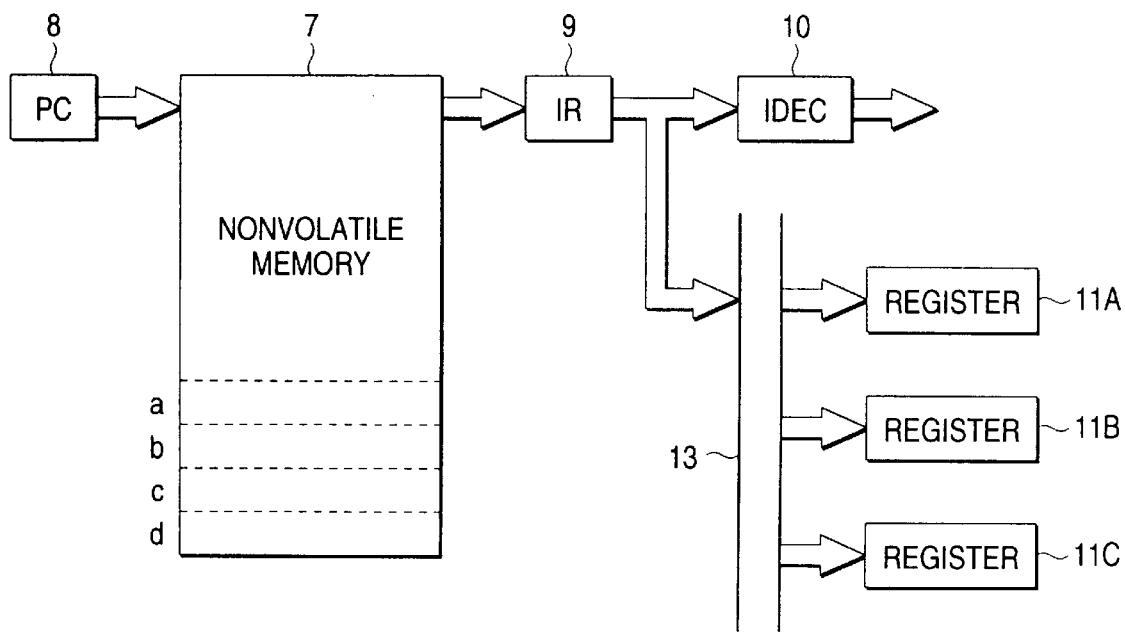

FIG. 3 is a block diagram showing the one-chip microcomputer of the invention.

Referring to FIG. 3, 7 denotes a nonvolatile memory (for example, a flash memory) in which data can be electrically erased and data can be repeatedly written and read, and into which program data for controlling the operation of the one-chip microcomputer are mainly stored.

In a memory cell 5 constituting the nonvolatile memory 7, the operations of writing, reading, and erasing data are usually implemented in the states shown in FIGS. 8 to 11.

Control data A for controlling the level or the time of the writing voltage of the nonvolatile memory 7, control data B for controlling the level or the time of the erasing voltage of the nonvolatile memory 7, control data C for controlling the level or the time of the reading voltage, control data D for controlling the level of a reference voltage Vref (corresponding to the reference current Iref) of a sense amplifier 6 in the reading operation of the nonvolatile memory 7, and the like are previously stored into specific address regions a, b, c, and d of the nonvolatile memory 7, respectively.

The reference numeral 8 denotes a program counter (PC) for addressing the nonvolatile memory 7, and 9 denotes an instruction register (IR) for holding data read out from the nonvolatile memory 7. The reference numeral 10 denotes an instruction decoder (IDEC) which decodes the data held by the instruction register 9 and outputs control signals for implementing various operations of the one-chip microcomputer.

The reference numerals 11A, 11B, and 11C denote registers for holding the control data A, B, and C which are held in the instruction register 9 and in the addresses a, b, and c, via a data bus 13.

The control data D in the address d of the nonvolatile memory 7 are reference control data for the reading operation. The control data D are applied to a reference voltage section of the sense amplifier 6, so that the reference voltage Vref is set based on the control data D simultaneously with initialization of the one-chip microcomputer.

FIG. 4 is a block diagram of a circuit for controlling the write time, the read time, and the erase time. It is assumed that the control data A, B, and C for controlling the write time, the read time, and the erase time are previously written in the addresses a, b, and c of the nonvolatile memory 7.

Referring to FIG. 4, 14 denotes a counter which is configured by cascade connecting plural T flip-flops. AND gates 15, 16, and 17, and an OR gate 18 constitute a switching circuit. Specific frequency division outputs X1, X2, and X3 (for example, 0.4 msec, 0.8 msec, and 1.6 msec) are applied to input terminals of one side of the AND gates 15, 16, and 17, respectively.

The register 11A holds control bits Y1, Y2, and Y3 for selecting one of the frequency division outputs X1, X2, and X3. The bits of the register 11A are connected to the other input terminals of the AND gates 15, 16, and 17, respectively.

When one of the frequency division outputs X1, X2, and X3 is to be selected, the corresponding one of the control bits Y1, Y2, and Y3 has the logical value "1." Therefore, one of the frequency division outputs X1, X2, and X3 which corresponds to one of the control bits Y1, Y2, and Y3 having the logical value "1" is output from the OR gate 18 so as to control the voltage application time of FIG. 8.

For example, the case will be considered where, depending on the write characteristics of the nonvolatile memory 7, the voltage application time of 0.4 msec is not sufficient, and that of 0.8 msec is sufficient. In this case, only the control bit Y2 is set to have the logical value "1," and the writing operation is performed on the basis of the frequency division output X2 of the counter 14. Also the registers 11B and 11C for the erasing and reading operations are configured in the same manner as FIG. 4.

FIG. 5 is a block diagram of a circuit for controlling the writing voltage, the erasing voltage, and the reading voltage. It is assumed that the control data A, B, and C for controlling the writing voltage, the erasing voltage, and the reading voltage are previously written in the addresses a, b, and c of the nonvolatile memory 7 in accordance with the respective operation characteristics of the nonvolatile memory 7.

Referring to FIG. 5, 19 denotes a high-voltage generating circuit which generates a voltage VPP. The cathode of a Zener diode 20 is connected to the output of the high-voltage generating circuit 19. Series circuits 21, 22, and 23 which are respectively configured by p, q, and r numbers of diodes (p>q>r) are connected in parallel to the anode side of the Zener diode 20.

The drains and sources of NMOS transistors 24, 25, and 26 which selectively connect or disconnect the Zener diode 20 to one of the diode series circuits 21, 22, and 23 are connected between the anode of the Zener diode 20 and the diode series circuits 21, 22, and 23. The gates of the NMOS transistors 24, 25, and 26 are connected to the bits of the registers 11A, respectively, so as to be controlled thereby.

The output Vpp of the high-voltage generating circuit 19 is lowered in the sequence of the cases where the NMOS transistors 24, 25, and 26 are turned off, where only the NMOS transistor 24 is turned off, where only the NMOS transistor 25 is turned off, and where only the NMOS transistor 26 is turned off.

For example, the case will be considered where, depending on the write characteristics of the nonvolatile memory 7 and under conditions that the voltage application time is constant, the level obtained when the NMOS transistor 26 is turned on is not sufficient for the writing voltage, and that obtained when the NMOS transistor 25 is turned on is sufficient for the writing voltage. In this case, only the control bit Y2 is set to have the logical value "1," and the source voltage of FIG. 8 is controlled.

Also the registers 11B and 11C for the erasing and reading operations are configured in the same manner as FIG. 5. In this case, the control gate voltage of FIG. 11 is controlled.

FIG. 6 is a block diagram of a circuit for controlling the reference voltage Vref of the sense amplifier 6. Specifically, the output current of the memory cell 5 and the reference current Iref are subjected to current-to-voltage conversion in the sense amplifier 6. Actually, the sense amplifier 6 is therefore configured so that the reference current Iref is not applied to the amplifier and the reference voltage Vref is applied thereto.

It is assumed that, in accordance with the characteristics of the nonvolatile memory 7, the control data D for controlling the reference voltage Vref are written in the address d of the nonvolatile memory 7.

Resistors 27, 28, 29, and 30 are connected in series between a power source VDD and the ground. The drains of NMOS transistors 31, 32, and 33 are connected to junctions between the series resistors 27, 28, 29, and 30, respectively, and the sources of the transistors are commonly connected together. The gates are directly controlled by control bits Z1, Z2, and Z3 in the address d, respectively.

The reference voltage Vref is gradually lowered as the NMOS transistors 31, 32, and 33 are sequentially turned on. For example, the case will be considered where, depending on the read characteristics of the nonvolatile memory 7, the level obtained when the NMOS transistor 33 is turned on is not sufficient for the reference voltage Vref, and that obtained when the NMOS transistor 32 is turned on is sufficient for the reference voltage. In this case, only the control bit Z2 is set to have the logical value "1," with the result that a correct logical value is obtained from the sense amplifier 6.

Hereinafter, the configuration which is a feature of the invention will be described with reference to FIG. 2.

Figure 2:
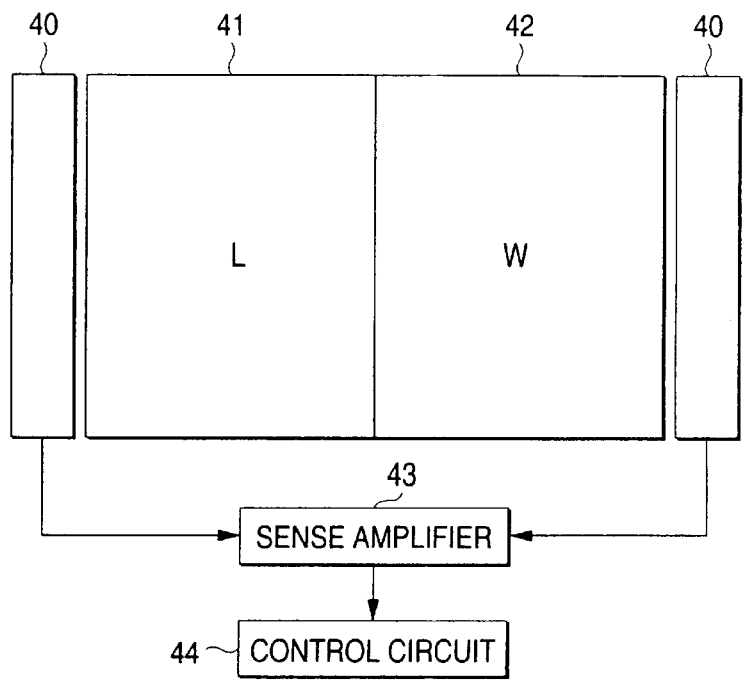
FIG. 2 is a diagram showing a memory cell array including the nonvolatile memory which is used in the invention.

FIG. 2 is a diagram showing the layout of a memory cell array to which the invention is applied. Referring to FIG. 2, 41 and 42 denote left and right memory cell arrays, respectively. On an end of each of the memory cell arrays, a reference nonvolatile memory group 40 which is connected to the same word line WL is disposed.

When a cell structure in which the gate length is longer than that of the nonvolatile memory 7 or the gate width is shorter than that of the nonvolatile memory is employed, the reference nonvolatile memory groups 40 can be formed as nonvolatile memories with erasing characteristics which are lower than those of the nonvolatile memory 7 (in this example, data are hardly erased).

The reference numeral 43 denotes a sense amplifier for reading data from the reference nonvolatile memory groups 40, and 44 denotes a control circuit.

The sense amplifier 43 has a circuit configuration which is equivalent to that of the sense amplifier 6 for reading data from the nonvolatile memory 7, and its reference current Iref is similarly set. Detailed description of the sense amplifier will be omitted in order to avoid duplicated description. As shown in FIG. 7, the output current (read current Ii) of each memory cell and the reference current Iref are subjected to current-to-voltage conversion in the sense amplifier 43. Actually, the sense amplifier 43 is therefore configured so that the reference current Iref is not applied to the amplifier and the reference voltage Vref is applied thereto.

In the thus configured nonvolatile memory 7, limitation on the operational life of the nonvolatile memory which limitation is conventionally caused by an erasure failure due to repeated operations of writing and reading data is reduced. The reference nonvolatile memory groups 40 which are lower in characteristics than the nonvolatile memory 7 (data are hardly erased) are disposed. Each time when data are written into the nonvolatile memory 7 connected to the word line, data are written also into the reference nonvolatile memory group 40 connected to the same word line. When the data written into the nonvolatile memory 7 are erased, the data written into the corresponding reference nonvolatile memory group 40 are erased.

Figure 1:
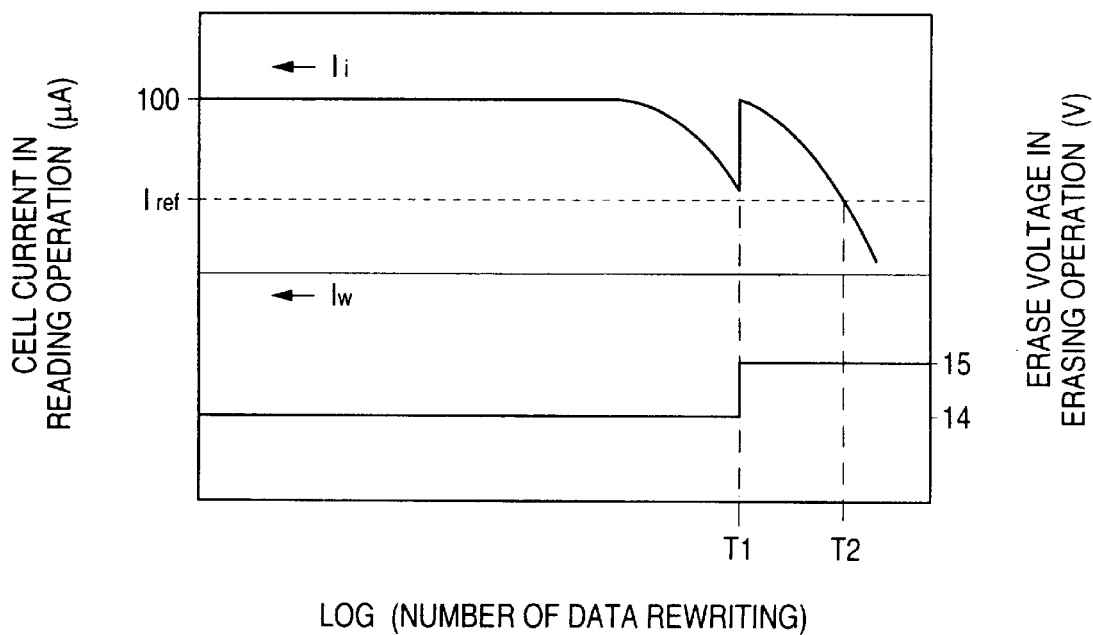
FIG. 1 is a characteristic diagram illustrating the operation of an embodiment of a nonvolatile memory which is used in the invention.

When, after the operations are repeated, the control circuit 44 detects via the sense amplifier 43 that the data contents of the reference nonvolatile memory group 40 are different from the set data contents (although the data-erased state or "1" state should be detected, the data-written state or "0" state is detected), the control circuit 44 controls the erase voltage so as to be changed to a desired one of the control data B (erase voltage data) for an erasing operation which are previously stored in the specific address b of the nonvolatile memory 7 (as shown in FIG. 1, when the erase voltage is raised from 14 V to 15 V, the number of rewritings is increased from T1 to T2). At this time, also the erase voltage of the reference nonvolatile memory group 40 must be similarly changed.

In this way, each time when a data rewriting operation is performed on a certain nonvolatile memory 7 connected to a word line, for example, a data rewriting operation is performed also on the reference nonvolatile memory group 40 which is connected to the same word line, and which is lower in characteristics than the nonvolatile memory 7 in the memory cell array. At the timing when a read failure is detected in which the data contents of the reference nonvolatile memory group 40 are different from the designated data contents (for example, a state where, although the data contents should be judged as "1," the data contents are judged as "0"), the erase voltage of the erasing operation corresponding to the nonvolatile memory 7 is raised (from V1 to V2, for example, from 14 V to 15 V). As a result, a margin is attained in the erasing operation, whereby the life of the nonvolatile memory 7 which may be shortened by an erasure failure can be extended. As a result, the life of the memory can be extended as compared with a prior art memory.

After the erase voltage of the erasing operation is changed, the rewriting operation on the nonvolatile memory 7 is then repeated with the changed erase voltage.

When it is again detected that the data contents of the reference nonvolatile memory group 40 are not correct, the control circuit 44 controls the erase voltage of the erasing operation so as to be raised (for example, from 15 V to 16 V), whereby the life of the nonvolatile memory 7 is further extended. Also the other nonvolatile memories 7 connected to the other word lines WL are similarly controlled so as to extend their life.

In the embodiment, when it is detected that the data contents of the reference nonvolatile memory group 40 are not correct, the control circuit 44 controls the erase voltage of the erasing operation so as to be raised. The invention is not restricted to this. The control circuit may perform a control so that the erase time is extended.

According to the invention, the erase voltage or the erase time of the erasing operation can be finely set, and, in an initial stage of the number of rewritings, it is not required to perform application of an excessively high voltage, or that of a constant voltage for a long time. Therefore, the progress of deterioration of the tunnel oxide film can be suppressed.

In the above, the embodiment in which the invention is applied to a so-called split gate nonvolatile memory has been described. Alternatively, for example, the invention may be applied also to a so-called stack type nonvolatile memory in which charges accumulated in a floating gate are moved toward a substrate (the source or the drain). In the alternative, a control is performed so as to raise the source or drain voltage which is to be applied to the source or drain electrode.

Hereinafter, another embodiment of the invention will be described with reference to FIG. 13.

In the other embodiment also, when, after rewriting/erasing operations are repeated, the control circuit 44 detects via the sense amplifier 43 that the data contents of the reference nonvolatile memory group 40 are different from the set data contents (although the data-erased state or "1" state should be detected, the data-written state or "0" state is detected), the control circuit 44 controls the reference voltage so as to be changed to a desired one of the control data D (reference voltage data) for an reading operation of the sense amplifier 6 which are previously stored in the specific address d of the nonvolatile memory 7 (as shown in FIG. 13, when the reference level is changed (for example, the reference current is reduced from Tref1 to Iref2), the number of rewritings is increased from T1 to T2). At this time, also the reference voltage of the reference sense amplifier 43 must be similarly changed.

In this way, each time when a data rewriting operation is performed on a certain nonvolatile memory 7 connected to a word line, for example, a data rewriting operation is performed also on the reference nonvolatile memory group 40 which is connected to the same word line, and which is lower in characteristics than the nonvolatile memory 7 in the memory cell array. At the timing when a read failure is detected in which the data contents of the reference nonvolatile memory group 40 are different from the designated data contents (for example, a state where, although the data contents should be judged as "1," the data contents are judged as "0"), the reference voltage of the reading operation of the sense amplifier 6 corresponding to the nonvolatile memory 7 is lowered (actually, the reference current is set, or specifically the reference current is reduced from Iref1 to Iref2 (for example, from 30 $\mu$A to 25 $\mu$A)). As a result, the judgement criteria of the sense amplifier 6 are relaxed, so that a margin is attained in the erasing operation, whereby the life of the nonvolatile memory 7 which may be shortened by a read failure can be extended. As a result, the life of the memory can be extended as compared with a prior art memory.

After the reference voltage of the reading operation of the sense amplifier 6 is changed, the rewriting operation on the nonvolatile memory 7 is then repeated with the changed reference voltage.

When it is again detected that the data contents of the reference nonvolatile memory group 40 are not correct, the control circuit 44 controls the reference voltage of the reading operation of the sense amplifier 6 so as to be lowered (for example, the reference current is reduced from 25 $\mu$A to 20 $\mu$A).

According to the invention, the judgement criteria in the reading operation of a sense amplifier can be finely set in the same manner, whereby the life of the nonvolatile memory 7 can be extended. Also the other nonvolatile memories 7 connected to the other word lines WL are similarly controlled so as to extend their life.

In the invention, particularly, the capability of a cell which is slightly lower in characteristics than an actual cell is evaluated. Therefore, it is possible to set judgment criteria which absorb variations among lots and due to results of production and meet the capability of each LSI. Consequently, the recovery and the yield are improved. In a wafer check or a measurement of a completed article, furthermore, it is possible to set judgment criteria which are more optimum and meet the capability of an IC.

The assignee of the present application has conducted an invention in which the number of data rewritings is counted and, when the counted number reaches a predetermined value, the erase voltage is changed (Japanese patent application No.HEI9-162788). In the prior invention, cumbersome works of obtaining the limit number of operations of a spare cell, and setting data must be previously performed. By contrast, in the present invention, a reference dummy cell is used. Therefore, the present invention has an advantage that the control is easy to perform.

As described above, according to the invention, a reference nonvolatile memory group which is lower in characteristic than a nonvolatile memory in a memory cell array is disposed, and, when a read failure occurs with respect to data contents which have been written into the reference nonvolatile memory group, a preset condition relating to erasure in the erasing operation is changed, whereby the life of the nonvolatile memory which may be shortened by an erasure failure can be extended. As a result, the life of the memory can be extended as compared with a prior art memory.

Similarly, a reference nonvolatile memory group which is lower in characteristic than a nonvolatile memory in a memory cell array is disposed. When a read failure occurs with respect to data contents which have been written into the reference nonvolatile memory group, a reference level of a reading operation of a sense amplifier is changed, whereby the life of the nonvolatile memory which may be shortened by a read failure can be extended. As a result, the life of the memory can be extended as compared with a prior art memory.

According to the invention, furthermore, a reference dummy cell is used, and, at the timing when an erasure failure occurs in the dummy cell, a preset condition relating to erasure in the subsequent erasing operation is changed, or a reference level of a reading operation of a sense amplifier is changed. Therefore, the control is easy to perform as compared with a configuration in which the limit number of operations of a spare cell is previously obtained and data of the allowable number of rewritings are set.

What is claimed is:

1. A one-chip microcomputer comprising a nonvolatile memory in which data electrically erasable and rewritable, as a program memory, said microcomputer comprising:

a reference nonvolatile memory in which data are hardly erased in comparison with a nonvolatile memory in a memory cell array; and a control circuit which, on the basis of a result of reference of said reference nonvolatile memory, changes a preset condition relating to an erasing operation, said preset condition being previously stored in a specific address region of said nonvolatile memory.

2. A one-chip microcomputer according to claim 1, wherein said preset condition which is controlled by said control circuit, and which relates to the erasing operation is an erase voltage or an erase time.

3. A one-chip microcomputer according to claim 1, wherein said reference nonvolatile memory has a cell structure in which a gate length is longer than a gate length of said nonvolatile memory in said memory cell array, or a cell structure in which a gate width is shorter than a gate width of said nonvolatile memory in said memory cell array.

4. A one-chip microcomputer that incorporates a nonvolatile memory in which data can be electrically erased and data can be written and read, as a program memory, said microcomputer comprising:

a reference nonvolatile memory in which data are hardly erased in comparison with a nonvolatile memory in a memory cell array; and a control circuit which, on the basis of a result of reference of said reference nonvolatile memory, changes a reference level of a reading operation of a sense amplifier, said reference level being previously stored in a specific address region of said nonvolatile memory.

5. A one-chip microcomputer according to claim 4, wherein said reference nonvolatile memory has a cell structure in which a gate length is longer than a gate length of said nonvolatile memory in said memory cell array, or a cell structure in which a gate width is shorter than a gate width of said nonvolatile memory in said memory cell array.

* * * * *